(12) United States Patent
Ohta et al.

(10) Patent No.: US 7,687,774 B2
(45) Date of Patent: Mar. 30, 2010

(54) INFRARED RAY SENSING ELEMENT AND METHOD OF PRODUCING THE SAME

(75) Inventors: Yoshimi Ohta, Yokohama (JP); Masaki Hirota, Zushi (JP)

(73) Assignee: Nissan Motor Co., Ltd., Yokohama-shi (JP)

( * ) Notice: Subject to any disclaimer, the term of this patent is extended or adjusted under 35 U.S.C. 154(b) by 159 days.

(21) Appl. No.: 11/598,196

(22) Filed: Nov. 13, 2006

(65) Prior Publication Data

US 2007/0114416 A1 May 24, 2007

(30) Foreign Application Priority Data

Nov. 15, 2005 (JP) ............................ 2005-330371

(51) Int. Cl.
 *G01J 5/02* (2006.01)
(52) U.S. Cl. ................. 250/338.1; 250/338.4
(58) Field of Classification Search .............. 250/338.1, 250/338.4
 See application file for complete search history.

(56) References Cited

U.S. PATENT DOCUMENTS 7,193,212 B2 * 3/2007 Hirota .................... 250/338.1
2002/0009821 A1 * 1/2002 Moor et al. .................. 438/48

FOREIGN PATENT DOCUMENTS

JP  2000-111396 A  4/2000

OTHER PUBLICATIONS

Shimozawa et al., Machine Translation of JP 2000-111396A.*

* cited by examiner

*Primary Examiner*—David P Porta
*Assistant Examiner*—Yara B Green
(74) *Attorney, Agent, or Firm*—Foley & Lardner LLP

(57) ABSTRACT

An infrared ray sensing element, includes: 1) a semiconductor substrate; 2) an infrared ray receiver disposed above the semiconductor substrate in such a manner as to be isolated from the semiconductor substrate, the infrared ray receiver being configured to receive an infrared ray; and 3) a beam configured to support the infrared ray receiver to the semiconductor substrate and include a thermopile configured to sense a temperature increase of the infrared ray receiver, wherein one of the following has a cross sectional shape that includes at least one protruding part: i) the beam, and ii) the thermopile.

8 Claims, 10 Drawing Sheets

(BENDING) 120

(TORSION) 120

DEFORMATION BY BENDING MOMENT

DEFORMATION BY TORSIONAL TORQUE

INFRARED RAY SENSING ELEMENT AND METHOD OF PRODUCING THE SAME

BACKGROUND OF THE INVENTION

1. Field of the Invention

The present invention relates to an infrared ray sensing element provided with a thermopile, and a method of producing the infrared ray sensing element.

2. Description of the Related Art

Japanese Patent Application Laid-Open No. 2000-111396 (=JP2000111396) discloses a conventional infrared sensing element and its manufacturing method. Specifically, JP2000111396 discloses a thermopile-type infrared ray sensing element. There is provided an infrared ray absorber on a center upper face of a substrate and a beam is used for supporting the infrared ray absorber to the substrate, thereby the infrared ray absorber is heat-isolated from the substrate.

FIG. 1A and FIG. 1B show a structure of a beam of the conventional infrared ray sensing element like that according to JP2000111396, specifically, FIG. 1A shows a perspective view of a beam 120 and FIG. 1B shows an upper face of the beam 120. In FIG. 1, the beam 120 has two polysilicons 121, 122 each serving as thermopile, specifically, an N-type polysilicon 121 and a P-type polysilicon 122 are formed in parallel to each other in a longitudinal direction of the beam 120. The N-type polysilicon 121 and P-type polysilicon 122 are covered with a protective film 123 made of silicon oxidized film and the like, with the beam 120 shaped rectangular.

When an external bending force is applied around a first center line b1 in FIG. 1B, the beam 120 is deformed as shown in FIG. 2A taken in the direction II-A in FIG. 1B. In this case, most of the above bending is caused to the protective film 123 since the N-type polysilicon and P-type polysilicon 121, 122 (thermopiles) are harder than the silicon oxidized film of the protective film 123. Meanwhile, when an external torsional force is applied around a second center line b2 in FIG. 1B, a sheer stress caused by the torsional force deforms the beam 120 as shown in FIG. 2B taken in the direction II-B in FIG. 1B. When the beam 120 has a bent portion between the substrate and the infrared ray absorber, displacement of the beam 120 in a height direction (Z-direction) is increased.

SUMMARY OF THE INVENTION

It is an object of the present invention to provide an infrared ray sensing element having an increased mechanical strength against bending stress or torsional stress, and a method of producing the infrared ray sensing element.

According to a first aspect of the present invention, there is provided an infrared ray sensing element, comprising: 1) a semiconductor substrate; 2) an infrared ray receiver disposed above the semiconductor substrate in such a manner as to be isolated from the semiconductor substrate, the infrared ray receiver being configured to receive an infrared ray; and 3) a beam configured to support the infrared ray receiver to the semiconductor substrate and include a thermopile configured to sense a temperature increase of the infrared ray receiver, wherein one of the following has a cross sectional shape that includes at least one protruding part: i) the beam, and ii) the thermopile.

According to a second aspect of the present invention, there is provided a method of producing an infrared ray sensing element, comprising: 1) a first step for forming a sacrificial layer on a semiconductor substrate; 2) a second step for forming on the sacrificial layer an infrared ray receiver configured to receive an infrared ray; 3) a third step for forming a thermopile configured to sense a temperature increase of the infrared ray receiver; 4) a fourth step for forming an insulative film configured to cover the thermopile and to serve as a protective film of the thermopile; 5) a fifth step for forming, by selectively removing the insulative film, a beam configured to support the infrared ray receiver to the semiconductor substrate and include the thermopile, the beam having a cross sectional shape that includes at least one protruding part; 6) a sixth step for forming an etching hole through the insulative film; and 7) a seventh step including the following sub-steps: i) a first sub-step for selectively removing the semiconductor substrate and the sacrificial layer via the etching hole, ii) a second sub-step for forming a void between the semiconductor substrate and the infrared ray receiver, and iii) a third sub-step for isolating the semiconductor substrate from the infrared ray receiver.

According to a third aspect of the present invention, there is provided a method of producing an infrared ray sensing element, comprising: 1) a first step for forming a sacrificial layer on a semiconductor substrate; 2) a second step for forming on the sacrificial layer an infrared ray receiver configured to receive an infrared ray; 3) a third step for forming a first resistor film configured to serve as a base part of a thermopile configured to sense a temperature increase of the infrared ray receiver; 4) a fourth step for forming a first insulative film configured to cover the first resistor film and to serve as a protective film of the thermopile; 5) a fifth step for forming a second resistor film on the first resistor film by selectively removing the first insulative film on the first resistor film, the second resistor film being configured to serve as a protruding part of the thermopile; 6) a sixth step including the following sub-steps: i) a first sub-step for forming a second insulative film configured to cover the second resistor film and to serve as the protective film of the thermopile, and ii) a second sub-step for forming a beam configured to support the infrared ray receiver to the semiconductor substrate and include the thermopile, the beam having a cross sectional shape having at least one of the protruding parts; 7) a seventh step for forming an etching hole through the protective film; and 8) an eighth step including the following sub-steps: i) a first sub-step for selectively removing the semiconductor substrate and the sacrificial layer via the etching hole, ii) a second sub-step for forming a void between the semiconductor substrate and the infrared ray receiver, and iii) a third sub-step for isolating the semiconductor substrate from the infrared ray receiver.

The other object(s) and feature(s) of the present invention will become understood from the following description with reference to the accompanying drawings.

DESCRIPTION OF THE PREFERRED EMBODIMENTS

In the following, various embodiments of the present invention will be described in detail with reference to the accompanying drawings.

For ease of understanding, the following description will contain various directional terms, such as left, right, upper, lower, forward, rearward and the like. However, such terms are to be understood with respect to only a drawing or drawings on which the corresponding part of element is illustrated.

Structure—First Embodiment

Figure 3:
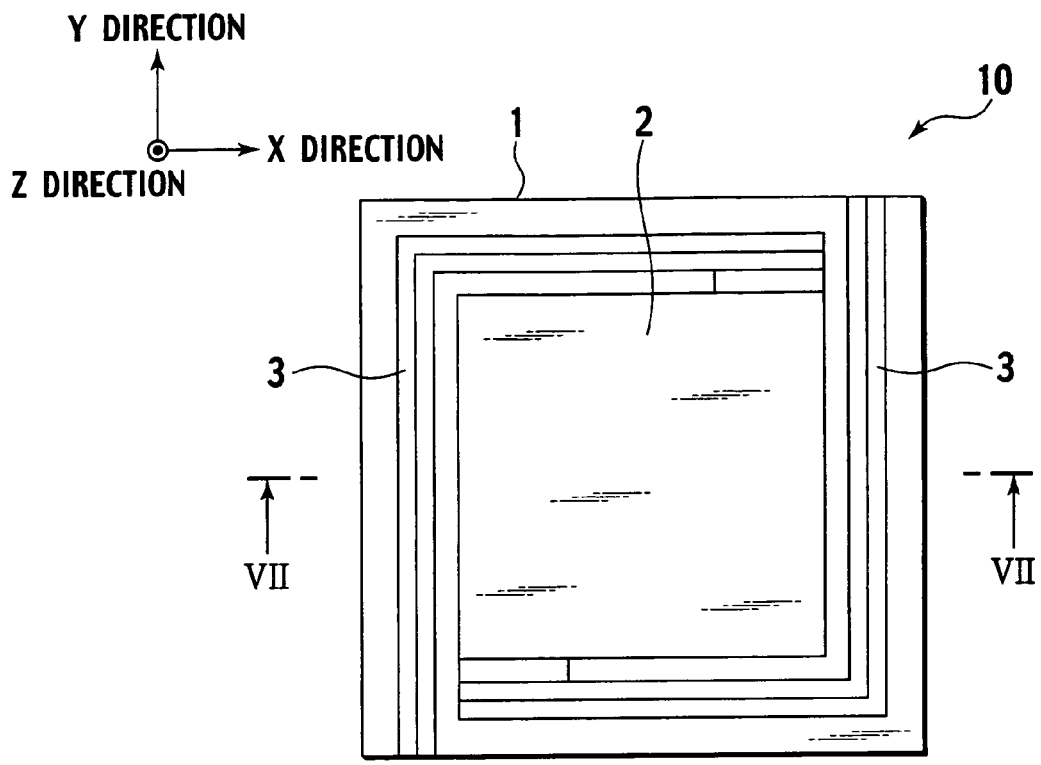
FIG. 3 is a front view of a structure of an infrared ray sensing element, according to a first embodiment of the present invention.

FIG. 3 is a front view of a structure of an infrared ray sensing element 10, according to a first embodiment of the present invention. The infrared ray sensing element 10 in FIG. 3 includes i) a substrate (otherwise referred to as "semiconductor substrate") 1 made of silicon and the like, ii) an infrared ray absorber (otherwise referred to as "infrared ray receiver") 2 formed above the substrate 1 and is made of a membrane for absorbing and sensing an infrared ray, and iii) an L-shaped beam 3.

Figure 7A:
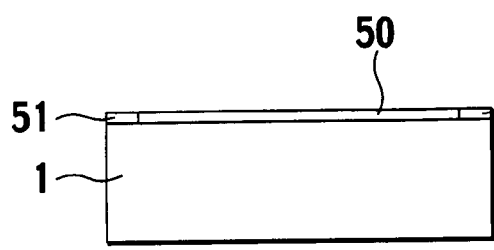
FIG. 7A to FIG. 7E are cross sectional views showing a method of producing the infrared ray sensing element, according to the first embodiment of the present invention.
Figure 7B:
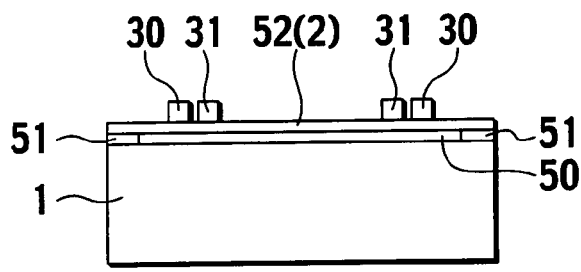
Figure 7C:
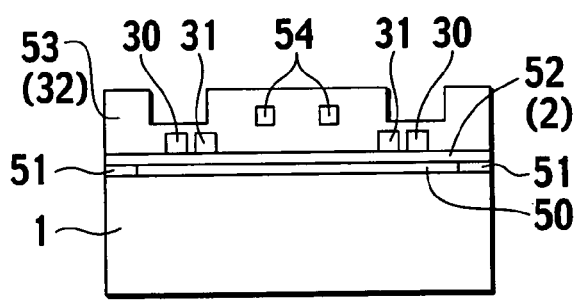
Figure 7D:
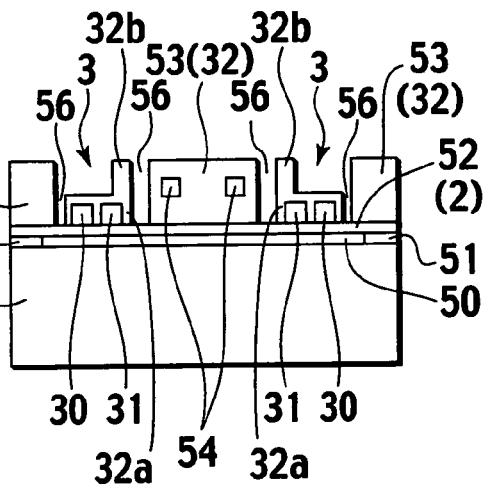
Figure 7E:
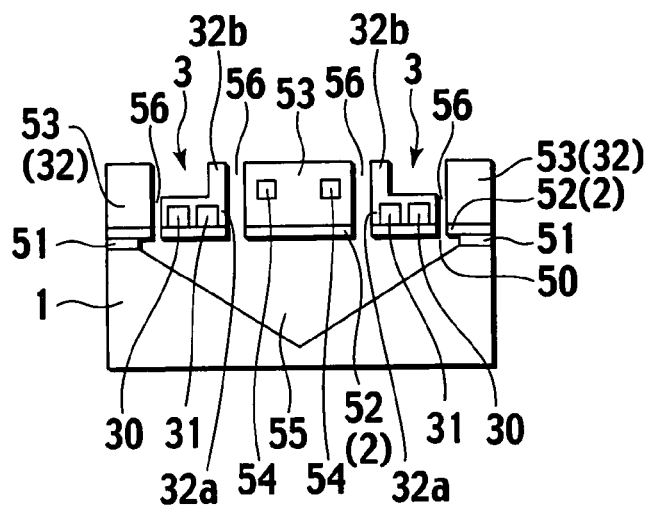

The substrate 1 and the infrared ray absorber 2 are heat-isolated by, for example, a pyramid void 55 (or a rectangular cone void, to be described afterward referring to FIG. 7E) which is a heat-isolating region formed on an upper face of the substrate 1. According to the first embodiment, the two beams 3 are formed along an outer periphery of the infrared ray absorber 2, thus connecting the substrate 1 with the infrared ray absorber 2 and supporting the infrared ray absorber 2 to the substrate 1 in such a manner that the infrared ray absorber 2 is isolated from the substrate 1. The beam 3 includes a pair of polysilicons serving as a thermopile covered with a protective film which is made of silicon oxidized film and the like and serves as a main member of the beam 3. The thermopile senses a temperature increase of the infrared ray absorber 2.

Figure 4:
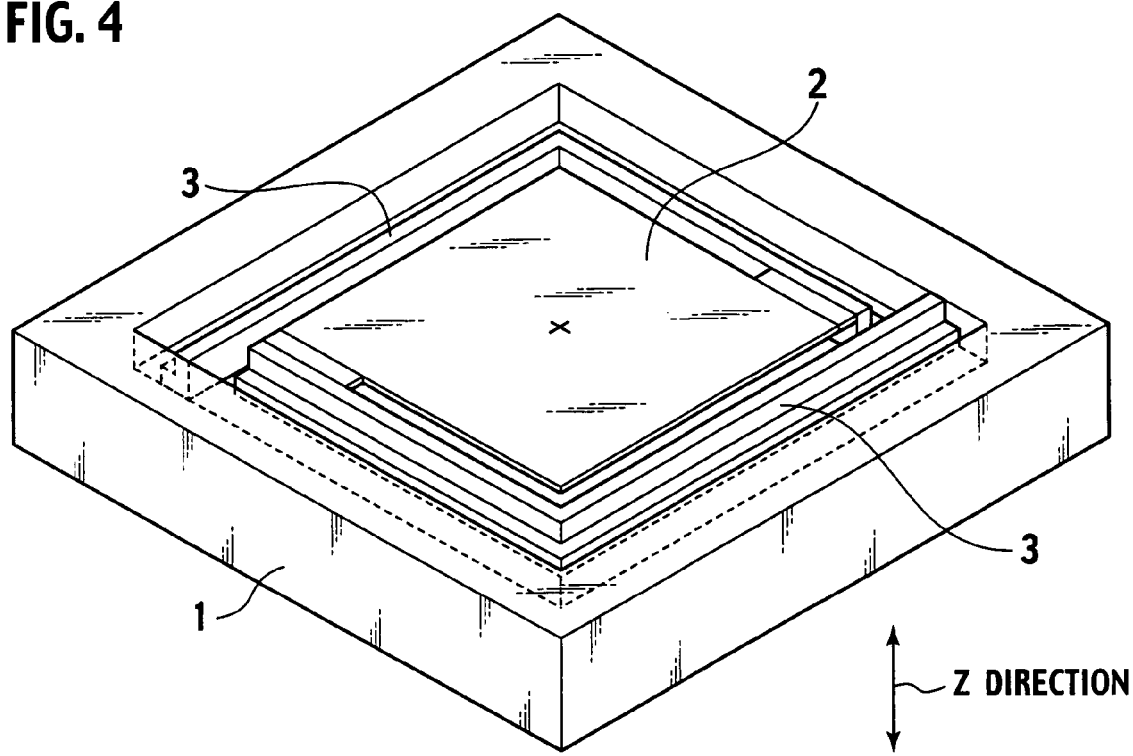
FIG. 4 is a perspective view of the structure of the infrared ray sensing element, according to the first embodiment of the present invention.

As shown in FIG. 3, the infrared ray absorber 2 is far larger in area and volume than the beam 3 supporting the infrared ray absorber 2. Therefore, the infrared ray absorber 2 works on the beam 3 like a weight. In FIG. 4 which is a perspective view of structure of the infrared ray sensing element 10, the infrared ray absorber 2 has a gravitational center x positioned in the center of the infrared ray absorber 2. Therefore, with an inertia caused by an acceleration, vibration and the like which are applied to the beam 3 in Z-direction in FIG. 4, a bending moment and a torsional torque operate from the infrared ray absorber 2 to the beam 3, causing a stress, thus deforming the beam 3 in the Z-direction. In this case, amount of the deformation depends on rigidity of the beam 3. Therefore, the smaller the deformation is, the higher a resonance frequency is, thus increasing rigidity of the beam 3.

Figure 5:
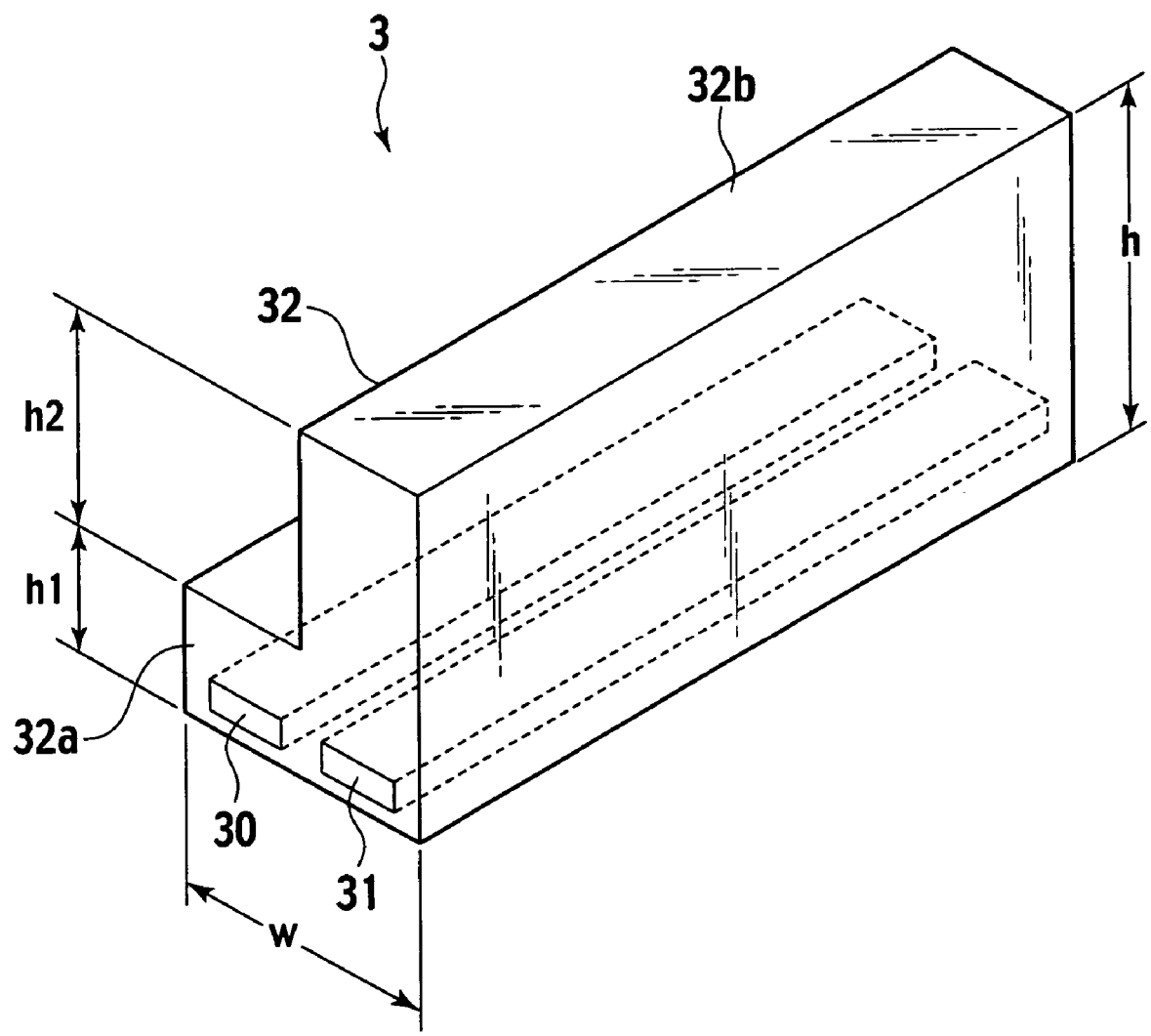
FIG. 5 is a perspective view of the structure of a beam of the infrared ray sensing element 10, according to the first embodiment of the present invention.

FIG. 5 is a perspective view of the structure of the beam 3 in FIG. 3. In FIG. 5, the beam 3 includes a pair of an N-type polysilicon 30 and a P-type polysilicon 31 each serving as a thermopile and disposed in parallel. The N-type polysilicon 30 and the P-type polysilicon 31 are covered with a protective film 32 made of silicon oxidized film. As shown in FIG. 5, the beam 3 has a structure where the protective film 32 has a base part 32a (bottom face part) and a protruding part 32b (convex part) which protrudes in the Z (height) direction. The protruding part 32b has a height h2 higher than a height h1 of the base part 32a (h1<h2). In this case, however, the cross section of the beam 3 according to the first embodiment of the present invention is as large as the cross section of the beam 120 in FIG. 1A according to the related art.

Figures 1A, 1B:
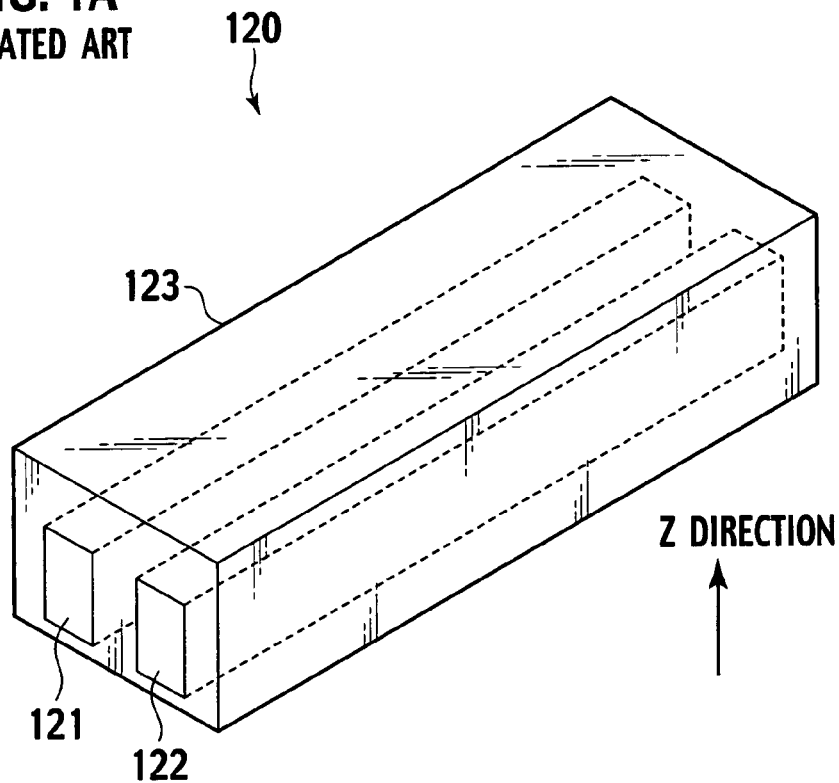
FIG. 1A and FIG. 1B show a structure of a beam of an infrared ray sensing element, according to a related art.
Figure 2A:
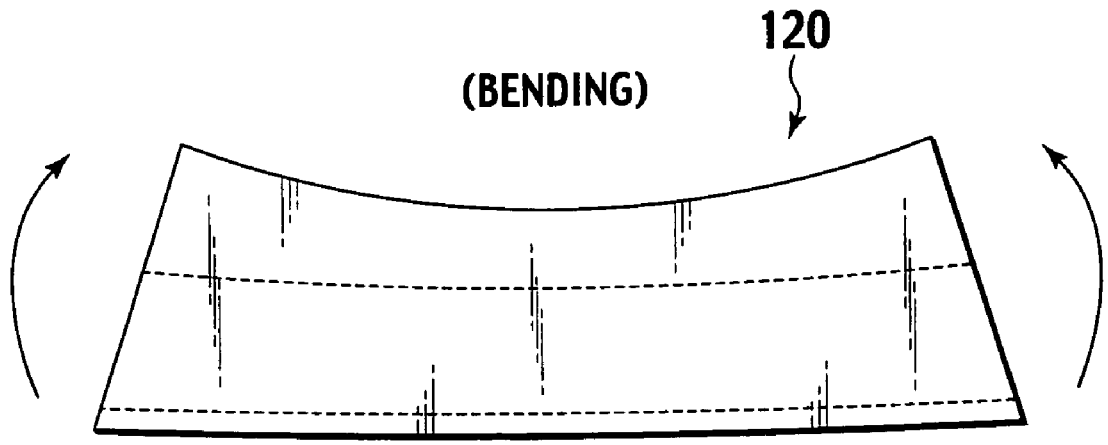
FIG. 2A taken in the direction II-A in FIG. 1B and FIG. 2B taken in the direction II-B in FIG. 1B show a deformation of the beam, according to the related art.
Figure 2B:
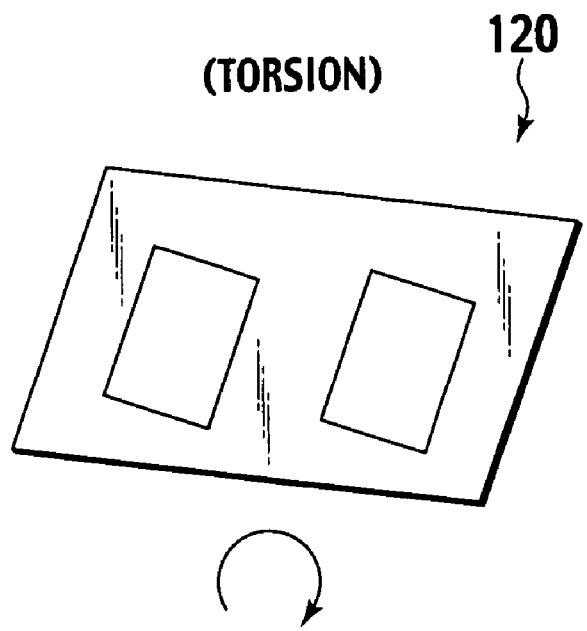
Figure 6A:
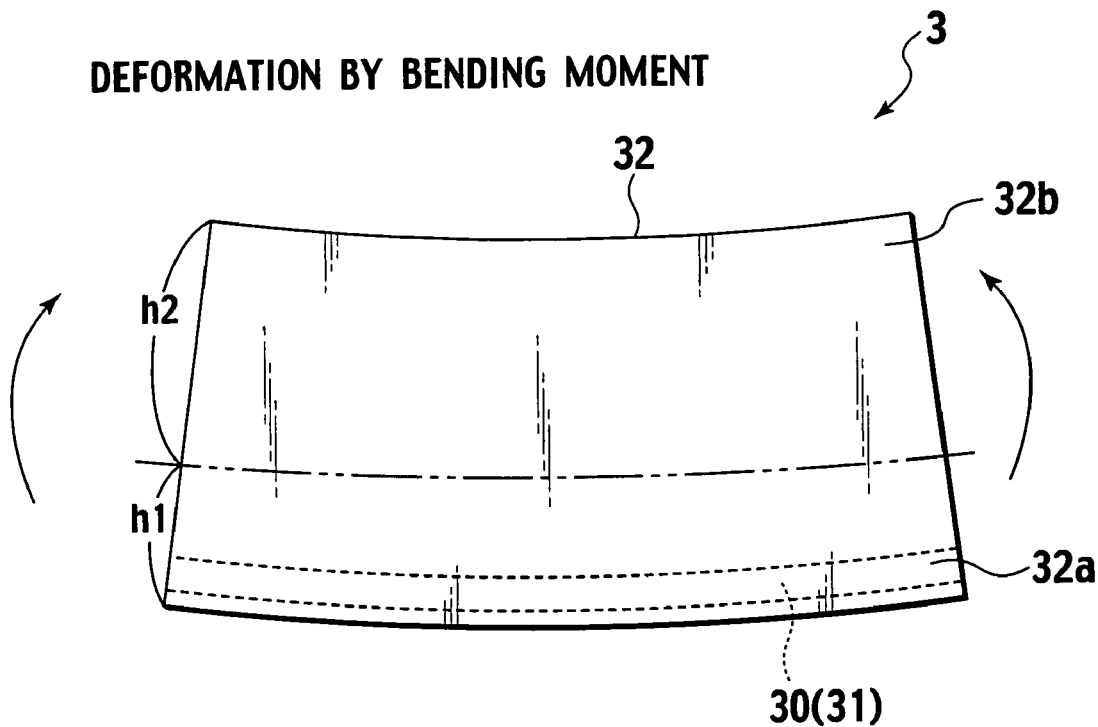
FIG. 6A and FIG. 6B show deformation of the beam of the infrared ray sensing element, according to the first embodiment of the present invention.

A Z-direction displacement in FIG. 4 may apply the bending moment to the beam 3 having the cross section in FIG. 6A. For the following reason, the deformation amount of the beam 3 in FIG. 6A is smaller than that according to the related art in FIG. 1A showing the rectangular cross sectional structure of the beam 120: Reason) In FIG. 5 (showing the L-shaped beam 3) and FIG. 6A, the height h2 of the protruding part 32b is higher than the height h1 of the base part 32a. The above sums up that the bending rigidity according to the first embodiment of the present invention is increased.

Figure 6B:
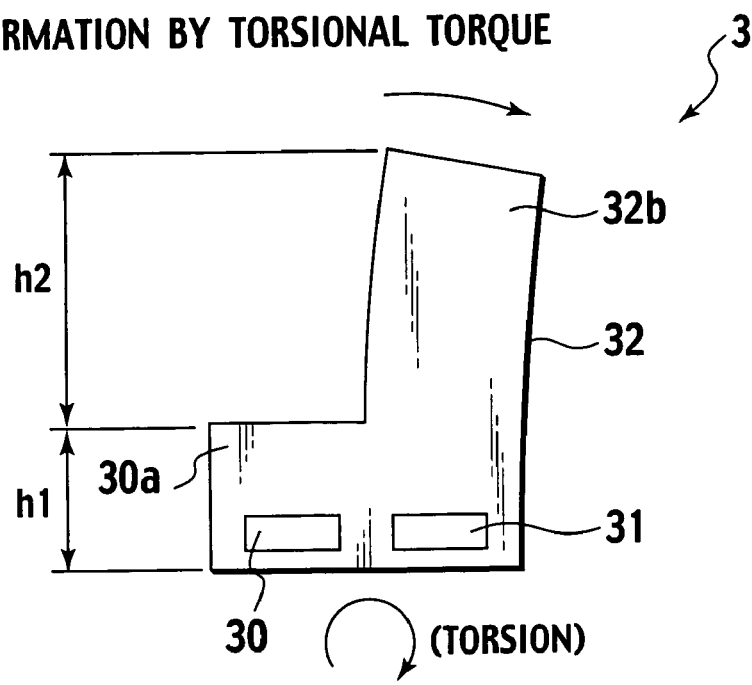

Meanwhile, when the Z-direction displacement relative to the infrared ray absorber 2 applies the torsional torque to the beam 3, the protruding part 32b having the height h2 higher than the height h1 of the base part 32a is so deformed as to incline, as shown in a cross sectional view of the beam 3 in FIG. 6B. With this, torsion of the entirety of the beam 3 can be suppressed, thus preventing torsion of the base part 32a of the beam 3, resulting in smaller Z-direction displacement amount than the related art. Moreover, the higher the height h2 of the protruding part 32b is, the smaller the beam 3's deformation amount caused by the torsion, thus increasing rigidity of the beam 3.

Furthermore, disposing the protruding part 32b on a side facing (or near to) the gravitational center x of the infrared ray absorber 2 can prevent a possible torsional stress or bending stress to the base part 32a of the beam 3.

As set forth above, the beam 3 having the structure according to the first embodiment of the present invention has higher rigidity of the beam 3 due to the protruding part 32b, than the beam 120 according to the related art having the rectangular cross sectional structure as shown in FIG. 1A. As a result, without varying the cross section of the beam 3, in other words, by keeping sensitivity of the infrared ray sensing element 10, the beam 3 can be increased in rigidity. With this, disposing the infrared ray sensing element 10 according to the first embodiment in a vibrating object, for example, a vehicle and the like can decrease a possible damage to the infrared ray sensing element 10, resulting in increased reliability.

The higher the height h2 of the protruding part 32b, the better for increased reliability of the beam 3. Specifically, with a width w of the beam 3, and a height h (=h1+h2) from a bottom face of the base part 32*a* to a summit of the protruding part 32*b*, meeting h>w can further increase the mechanical strengthen the beam 3.

With the infrared ray sensing element 10 according to the first embodiment, the two bended beams 3 are shown in FIG. 3. However, the number of beams 3 is not specifically limited. Moreover, the two thermopiles are shown according to the first embodiment, that is, the N-type polysilicon 30 and the P-type polysilicon 31. However, the number of thermopiles is not specifically limited.

Production Method—First Embodiment

Then, referring to cross sectional views showing production steps in FIG. 7A to FIG. 7E, a method of producing the infrared ray sensing element 10 having the beam 3 in FIG. 5 is to be set forth. Each of the cross sections of the elements in FIG. 7A to FIG. 7E is taken along the lines VII-VII in FIG. 3.

FIG. 7A:

<First Step>

First, a sacrificial layer 50 for polysilicon etching is formed on a main surface of the substrate 1 made of silicon and the like, and an etching stopper 51 for determining a range of the void 55 for heat-isolating the infrared ray absorber 2 from the substrate 1 is formed.

FIG. 7B:

<Second Step>

Then, on the sacrificial layer 50 and the etching stopper 51, a nitride film 52 for serving afterward as the infrared ray absorber 2 is formed.

<Third Step>

On the nitride film 52, the N-type polysilicon 30 and P-type polysilicon 31 for serving afterward as a resistor film of the thermopile are formed by patterning.

FIG. 7C:

<Fourth Step>

Then, a silicon oxidized film 53 made of insulative film and serving afterward as the protective film 32 is deposited in such a manner as to cover the thermopiles, that is, the N-type polysilicon 30 and P-type polysilicon 31. Then, an aluminum wiring 54 is formed for connecting the N-type polysilicon 30 and the P-type polysilicon 31 in series.

<Fifth Step>

Furthermore, the silicon oxidized film 53 corresponding to a part serving afterward as the beam 3 on the N-type polysilicon 30 and P-type polysilicon 31 is selectively removed by etching, to thereby form the protective film 32 corresponding to the base part 32*a* of the beam 3.

FIG. 7D:

<Sixth Step>

Then, the silicon oxidized film 53 is selectively removed by etching, to thereby form a slit 56 (otherwise referred to as "etching hole") reaching the nitride film 52. From the nitride film 52 as the infrared ray absorber 2, the slit 56 isolates the silicon oxidized film 53 as the protective film 32 of the beam 3. With this, the beam 3 is thus formed having the cross sectional structure where the protruding part 32*b* is disposed on the base part 32*a*.

FIG. 7E:

<Seventh Step>

Finally, via the slit 56 formed by the sixth step in FIG. 7D, a crystal anisotropy etching is implemented using an etching solution such as hydrazine, Through the crystal anisotropy etching, the nitride film 52, the sacrificial layer 50 and the substrate 1 are removed, to thereby form the void 55, thus completing the infrared ray sensing element 10 in FIG. 3.

Through the above production steps, the L-shaped beam 3 including the thermopiles (the N-type polysilicon 30 and the P-type polysilicon 31) can be easily formed on the infrared ray sensing element 10.

Structure—Second Embodiment

Figure 8:
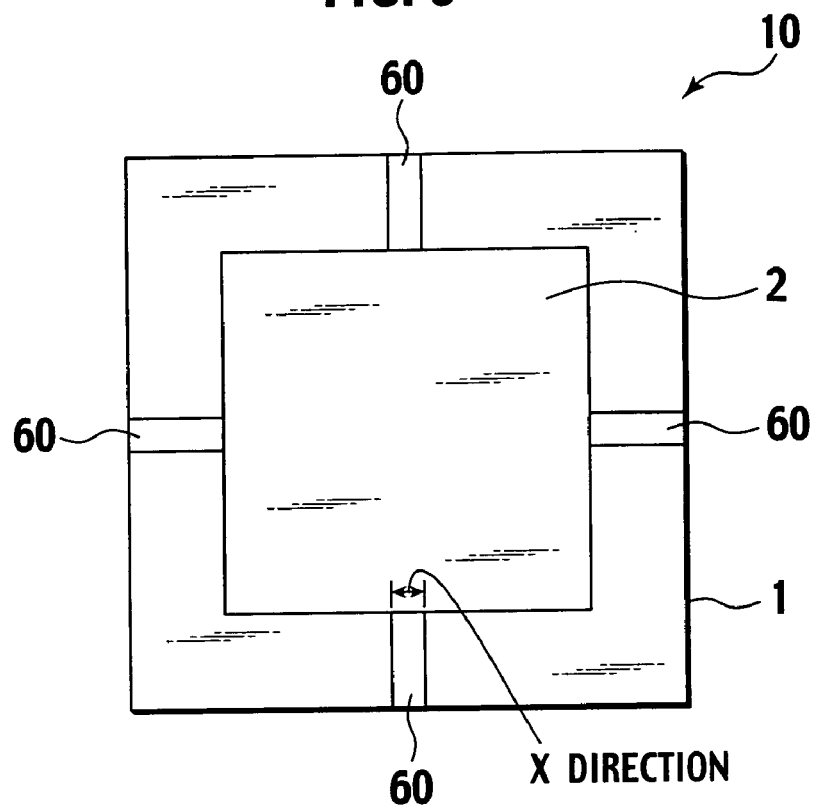
FIG. 8 is a front view of the structure of the infrared ray sensing element, according to a second embodiment of the present invention.

FIG. 8 is a front view showing the structure of the infrared ray sensing element 10, according to a second embodiment of the present invention. As described above according to the first embodiment, the two beams 3 are formed along the outer periphery of the infrared ray absorber 2. Meanwhile, four beams 60 are respectively formed on four sides opposing orthogonally to each other on the outer periphery where the substrate 1 opposes the infrared ray absorber 2, to thereby connect the substrate 1 with the infrared ray absorber 2, according to the second embodiment.

Figure 9A:
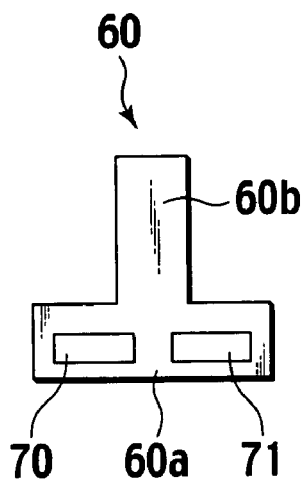
FIG. 9A to FIG. 9C are cross sectional views showing the structure of a beam of the infrared ray sensing element, according to the second embodiment of the present invention.
Figure 9B:
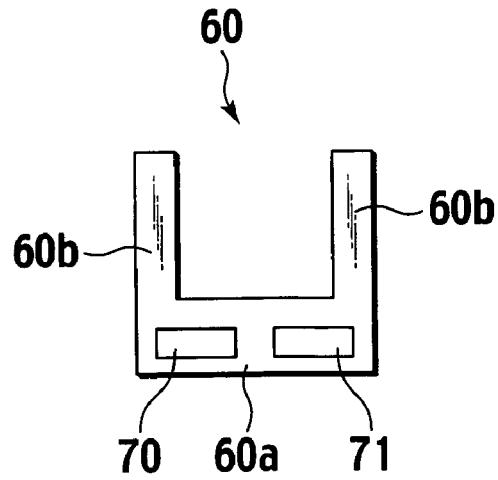
Figure 9C:
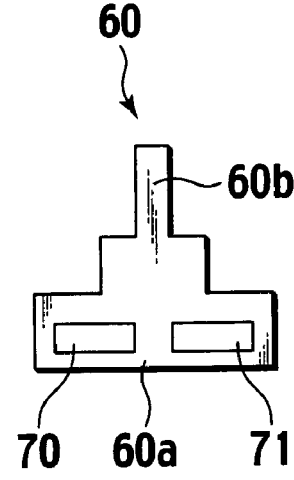

The four beams 60 supporting the infrared ray absorber 2 to the substrate 1 can prevent the torsion from being applied to the beam 60 even when the infrared ray absorber 2 is vibrated in the Z-direction. Therefore, with the above structure according to the second embodiment, a protruding part 60*b* can be formed anywhere on a base part 60*a* of the beam 60. For example, as shown in the cross sectional view in FIG. 9, the protruding part 60*b* may be disposed in any of the following locations:

i) in the center of the base part 60*a* covering an N-type polysilicon 70 and a P-type polysilicon 71 (thermopiles) of the beam 60 (FIG. 9A), ii) at both ends in the X-direction (shorter direction) of the base part 60*a* (FIG. 9B), and iii) in the center on the base part 60*a* in such a manner as to have a step (FIG. 9C).

According to the second embodiment showing the beam 60 having the above structure, when the bending stress or torsional stress is applied to the infrared ray sensing element 10, the protruding part 60*b* deformed like the protruding part 32*b* according to the first embodiment can decrease the stress applied to the base part 60*a* of the beam 60. With this, deformation of the entirety of the beam 60 can be decreased according to the second embodiment, thereby bringing about substantially the same effect as that brought about according to the first embodiment.

Structure—Third Embodiment

Figure 10:
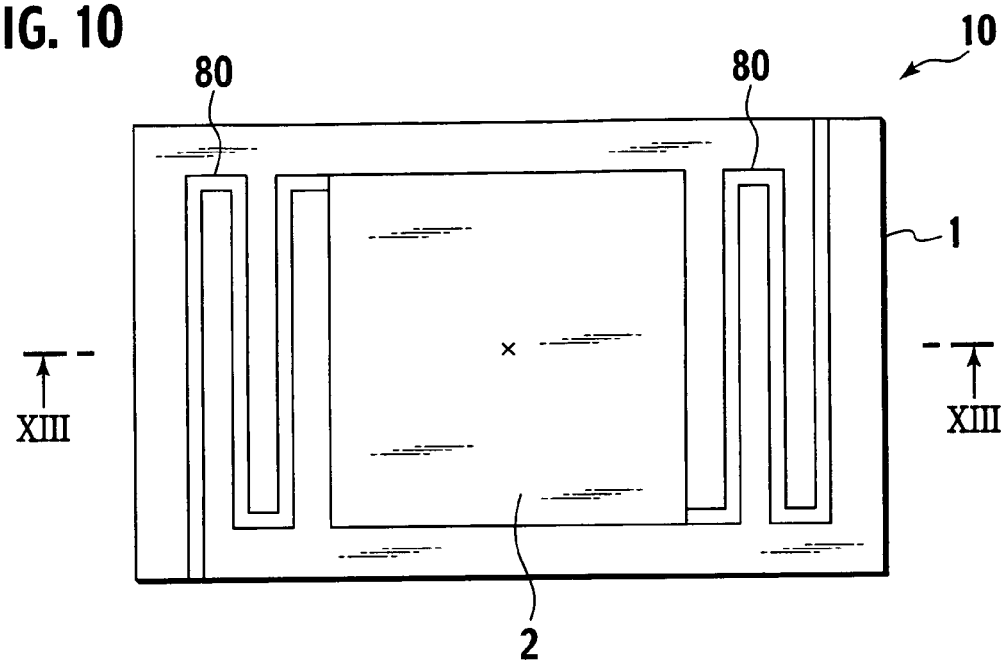
FIG. 10 is a front view of the structure of the infrared ray sensing element, according to a third embodiment of the present invention.
Figure 11A:
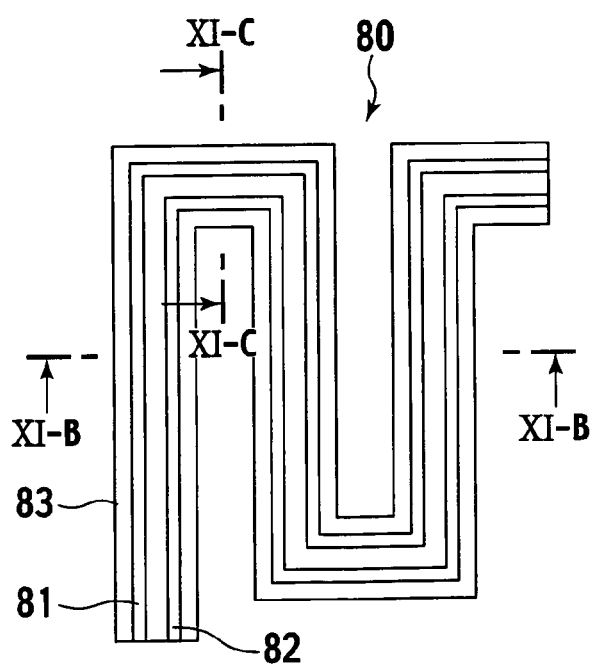
FIG. 11A to FIG. 11C show a structure of a beam of the infrared ray sensing element, according to the third embodiment of the present invention.
Figure 11B:
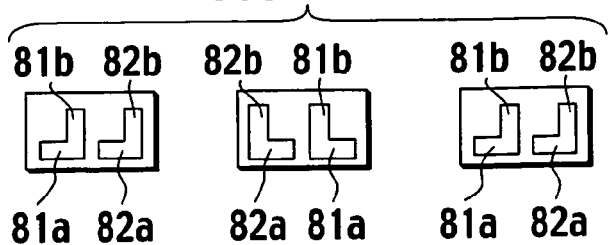
Figure 11C:
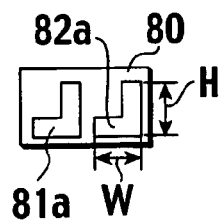

FIG. 10 is a front view showing the structure of the infrared ray sensing element 10, according to a third embodiment of the present invention. FIG. 11A to FIG. 11C show a structure of a beam 80 in FIG. 10. FIG. 11A is a front view. FIG. 11B and FIG. 11C are cross sectional views taken along the respective lines XI-B-XI-B and XI-C-XI-C in FIG. 11A. According to the third embodiment in FIG. 10 and FIG. 11A to FIG. 11C, the polysilicon of thermopile in the beam 80 for supporting the infrared ray absorber 2 to the substrate 1 is shaped into an alphabetical L in cross section. A protective film for covering the thermopile has a rectangular cross sectional shape, like the related art in FIG. 1.

Specifically, the thermopiles include an N-type polysilicon 81 (including a base part 81*a* and a protruding part 81*b*) and a P-type polysilicon 82 (including a base part 82*a* and a protruding part 82*b*), and a protective film 83 for covering the thermopiles is made of silicon oxidized film. The polysilicon of the N-type polysilicon 81 and P-type polysilicon 82 is harder than the silicon oxidized film of the protective film 83, specifically, greater in Young's modulus by three times or more. Therefore, according to the third embodiment, instead of increasing the mechanical strength of the protective film 83, the N-type polysilicon 81 and P-type polysilicon 82 of the hard thermopile is increased in mechanical strength against bending stress and torsional stress.

As shown in FIG. 11B and FIG. 11C, the N-type polysilicon 81 and P-type polysilicon 82 each have an L-shaped cross section. In FIG. 11B, two (left and right) of three cross sections have the protruding part 81b and protruding part 82b formed on a side facing (or near to) the gravitational center× of the infrared ray absorber 2, thus increasing rigidity of the beam 80.

With this, forming the N-type polysilicon 81 and P-type polysilicon 82 (which are harder than the silicon oxidized film of the protective film 83) shaped into alphabetical L so as to have the respective protruding parts 81 b, 82b can increase height of the N-type polysilicon 81 and P-type polysilicon 82, thereby suppressing deformation caused by bending of the beam 80, resulting in increased mechanical strengthening of the entire beam 80. Moreover, most of sheer stresses applied to the beam 80 can be absorbed by the N-type polysilicon 81 and P-type polysilicon 82, decreasing deformation of the beam 80. Thereby, the beam 80 can be increased in mechanical strength against torsion.

Preferably, the higher the protruding parts 81b, 82b, the higher the rigidity of the N-type polysilicon 81 and P-type polysilicon 82. Therefore, a width W of each of the N-type polysilicon 81 and P-type polysilicon 82 and a height H of each of the N-type polysilicon 81 and P-type polysilicon 82 preferably meet H>W, thus further increasing rigidity of the beam 80.

Figure 12A:
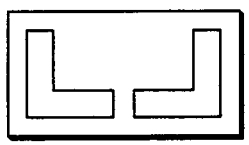
FIG. 12A to FIG. 12J are cross sectional views showing other structures of the beam of the infrared ray sensing element, according to the third embodiment of the present invention.
Figure 12B:
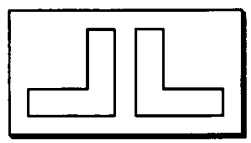
Figure 12C:
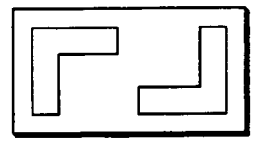
Figure 12D:
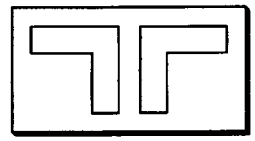
Figure 12E:
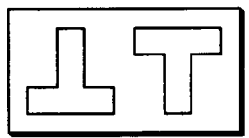
Figure 12F:
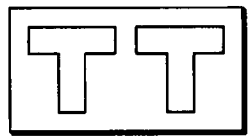
Figure 12G:
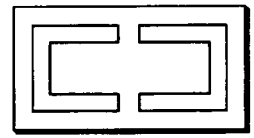
Figure 12H:
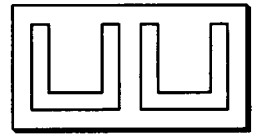
Figure 12I:
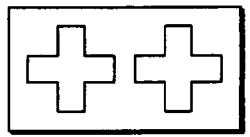
Figure 12J:
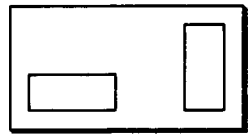

Moreover, according to the third embodiment, the parallel disposition of the L-shaped N-type polysilicon 81 with the L-shaped P-type polysilicon 82 is not limited to the one shown in FIG. 11B and FIG. 11C. For example, the above parallel disposition may be those shown in FIG. 12A to FIG. 12D. Moreover, the cross sectional shape of each of the N-type polysilicon 81 and P-type polysilicon 82 is not limited to the alphabetical L, for example, an alphabetical T as shown in FIG. 12E to FIG. 12F, an alphabetical C as shown in FIG. 12G to FIG. 12H, and a cross as shown in FIG. 12I each are allowed. Moreover, as shown in FIG. 12J, both polysilicons of the thermopiles may be rectangular like the two polysilicons 121, 122 according to the related art in FIG. 1. In this case, however, any one of the polysilicons in FIG. 12J should have an aspect ratio (height/width) of 1 or over.

Production Method—Third Embodiment

Then, referring to cross sectional views showing production steps in FIG. 13A to FIG. 13F, a method of producing the infrared ray sensing element 10 having the beam 80 in FIG. 10 and FIG. 11A to FIG. 11C is to be set forth. Each of the cross sections of the elements in FIG. 13A to FIG. 13F is taken along the lines XIII-XIII in FIG. 10.

FIG. 13A:

<First Step>

First, a sacrificial layer 110 for polysilicon etching is formed on a main surface of the substrate 1 made of silicon and the like, and an etching stopper 111 for determining a range of an after-described void 117 (see FIG. 13F) for heat-isolating the infrared ray absorber 2 from the substrate 1 is formed.

FIG. 13B:

<Second Step>

Then, on the sacrificial layer 110 and the etching stopper 111, a nitride film 112 for serving afterward as the infrared ray absorber 2 is formed.

<Third Step>

On the nitride film 112, the base part 81a (of N-type polysilicon 81) and base part 82a (of P-type polysilicon 82) for serving afterward as a first resistor film of the thermopile are formed by patterning.

FIG. 13C:

<Fourth Step>

Then, a silicon oxidized film 113a which is a first insulative film serving afterward as the protective film 83 is deposited in such a manner as to cover the base part 81a (of N-type polysilicon 81) and base part 82a (of P-type polysilicon 82).

<Fifth Step>

Then, by an anisotropy etching such as an RIE (Reactive Ion Etching) method, the silicon oxidized film 113a for serving afterward as the protruding part 81b and protruding part 82b (second resistor films) of the beam 80 is selectively removed, to thereby form a slit 114.

FIG. 13D:

<Sixth Step>

Figure 13A:
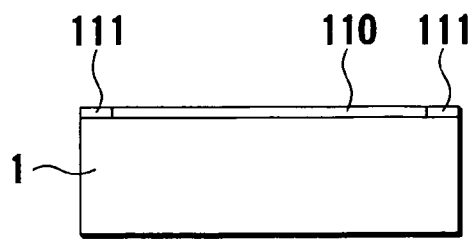
FIG. 13A to FIG. 13F are cross sectional views showing a method of producing the infrared ray sensing element, according to the third embodiment of the present invention.
Figure 13B:
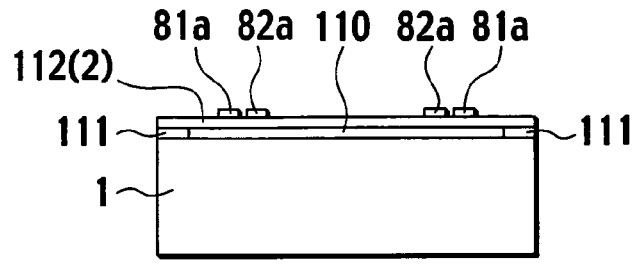
Figure 13C:
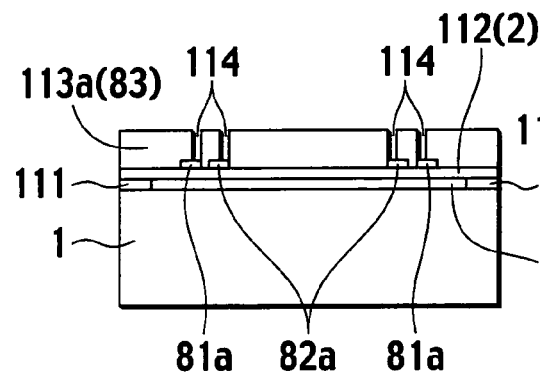
Figure 13D:
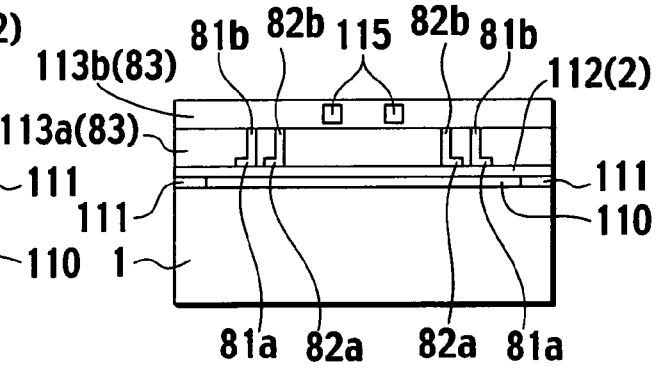

Then, the polysilicon is deposited on substantially an entire face, to thereby embed the polysilicon into the slit 114 which was formed in the fifth step in FIG. 13C. Then, an etch back is implemented to such an extent that the silicon oxidized film 113a deposited in the fifth step in FIG. 13C has an exposed surface, to thereby remove the polysilicon. With this, the protruding part 81b and protruding part 82b of the polysilicons are formed respectively on an upper face of the N-type polysilicon 81 and an upper face of the P-type polysilicon 82. Then, impurities such as boron or phosphor are added to the protruding part 81b and protruding part 82b of the polysilicons by an ion implantation. With this, the same type protruding parts 81b are formed on the N-type polysilicon 81, while the same type protruding parts 82b are formed on the P-type polysilicon 82. Then, a silicon oxidized film 113b which is a second insulative film serving afterward as the protective film 83 is deposited in such a manner as to cover the protruding part 81a (of N-type polysilicon 81) and protruding part 82b (of P-type polysilicon 82). Then, an aluminum wiring 115 is formed for connecting the N-type polysilicon 81 with the P-type polysilicon 82.

Figure 13E:
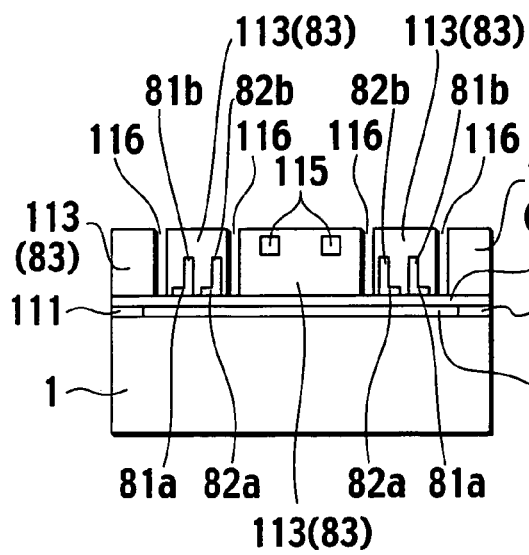
Figure 13F:
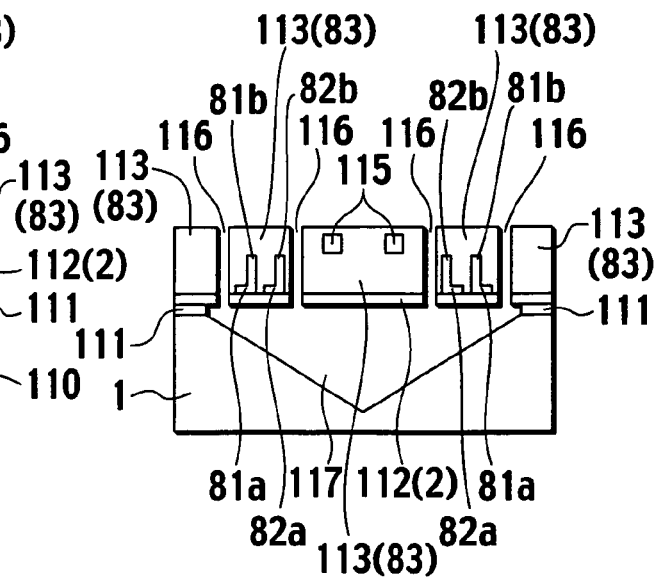

FIG. 13E: ps <Seventh Step>

Then, the silicon oxidized films 113a, 113b are selectively removed by etching and the like, to thereby form a slit 116 (otherwise referred to as "etching hole") reaching the nitride film 112. From the nitride film 112 as the infrared ray absorber 2, the slit 116 isolates the silicon oxidized films 113a, 113b (=silicon oxidized film 113) as the protective film 83 of the beam 80.

FIG. 13F:

<Eighth Step>

Finally, via the slit 116 formed by the seventh step in FIG. 13E, a crystal anisotropy etching is implemented using an etching solution such as hydrazine. Through the crystal anisotropy etching, the nitride film 112, the sacrificial layer 110 and the substrate 1 are removed, to thereby form the void 117, thus completing the infrared ray sensing element 10 in FIG. 3.

Through the above production steps, the beam 80 including the L-shaped thermopiles (N-type polysilicon 81 and P-type polysilicon 82) can be easily formed on the infrared ray sensing element 10.

Although the present invention has been described above by reference to three certain embodiments, the present invention is not limited to the three embodiments described above. Modifications and variations of the three embodiments described above will occur to those skilled in the art, in light of the above teachings.

This application is based on a prior Japanese Patent Application No. P2005-330371 (filed on Nov. 15, 2005 in Japan). The entire contents of the Japanese Patent Application No. P2005-330371 from which priority is claimed are incorporated herein by reference, in order to take some protection against translation errors or omitted portions.

The scope of the present invention is defined with reference to the following claims.

What is claimed is:

1. An infrared ray sensing element, comprising:
a semiconductor substrate;
an infrared ray receiver disposed above the semiconductor substrate in such a manner as to be isolated from the semiconductor substrate, the infrared ray receiver being configured to receive an infrared ray; and
a beam configured to support the infrared ray receiver to the semiconductor substrate and including at least one thermopile configured to sense a temperature increase of the infrared ray receiver,
wherein the at least one thermopile has a cross sectional shape that includes at least one protruding part, and
the protruding part of the at least one thermopile is formed on a side facing a gravitational center of the infrared ray receiver.

2. An infrared ray sensing element, comprising:
a semiconductor substrate;
an infrared ray receiver disposed above the semiconductor substrate in such a manner as to be isolated from the semiconductor substrate, the infrared ray receiver being configured to receive an infrared ray; and
a beam configured to support the infrared ray receiver to the semiconductor substrate and including at least one thermopile configured to sense a temperature increase of the infrared ray receiver,
wherein the at least one thermopile has a cross sectional shape that includes at least one protruding part, and
wherein the at least one thermopile is made of a polysilicon and is covered with a protective film made of a silicon oxidized film, and
wherein the at least one thermopile is harder than the protective film.

3. An infrared ray sensing element, comprising:
a semiconductor substrate;
an infrared ray receiver disposed above the semiconductor substrate in such a manner as to be isolated from the semiconductor substrate, the infrared ray receiver being configured to receive an infrared ray; and
a beam configured to support the infrared ray receiver to the semiconductor substrate and including at least one thermopile configured to sense a temperature increase of the infrared ray receiver,
wherein the at least one thermopile has a cross sectional shape that includes at least one protruding part, and
wherein the at least one thermopile is made of polysilicon and is covered with a protective film made of a silicon oxidized film,
wherein the at least one thermopile is harder than the protective film, and
wherein a height of the at least one thermopile is greater than a width of the thermopile.

4. An infrared ray sensing element, comprising:
a semiconductor substrate;
an infrared ray receiver disposed above the semiconductor substrate in such a manner as to be isolated from the semiconductor substrate, the infrared ray receiver being configured to receive an infrared ray; and
a beam configured to support the infrared ray receiver to the semiconductor substrate and including at least one thermopile configured to sense a temperature increase of the infrared ray receiver,
wherein the at least one thermopile has a cross sectional shape that includes at least one protruding part, and
the cross sectional shape of the at least one thermopile is any of the following:
an alphabetical L,
an alphabetical T,
an alphabetical C,
a cross, and
at least one thermopile has an aspect ratio of 1 or over.

5. A method of producing an infrared ray sensing element, comprising:
1) a first step for forming a sacrificial layer on a semiconductor substrate;
2) a second step for forming on the sacrificial layer an infrared ray receiver configured to receive an infrared ray;
3) a third step for forming at least one thermopile configured to sense a temperature increase of the infrared ray receiver;
4) a fourth step for forming an insulative film configured to cover the thermopile and to serve as a protective film of the thermopile;
5) a fifth step for forming, by selectively removing the insulative film, a beam configured to support the infrared ray receiver to the semiconductor substrate, wherein the beam includes the at least one thermopile, wherein the at least one thermopile has a cross sectional shape that includes at least one protruding part, wherein the protruding part of the at least one thermopile is formed on a side facing a gravitational center of the infrared ray receiver;
6) a sixth step for forming an etching hole through the insulative film; and
7) a seventh step including the following sub-steps:
i) a first sub-step for selectively removing the semiconductor substrate and the sacrificial layer via the etching hole,
ii) a second sub-step for forming a void between the semiconductor substrate and the infrared ray receiver, and
iii) a third sub-step for isolating the semiconductor substrate from the infrared ray receiver, wherein the infrared ray receiver is disposed above the semiconductor substrate in such a manner as to be isolated from the semiconductor substrate.

6. The method of producing the infrared ray sensing element as claimed in claim 5, wherein the first step includes a sub-step for forming an etching stopper for determining a range of the void configured to heat-isolate the infrared ray receiver from the substrate.

7. A method of producing an infrared ray sensing element, comprising:
1) a first step for forming a sacrificial layer on a semiconductor substrate;
2) a second step for forming on the sacrificial layer an infrared ray receiver configured to receive an infrared ray;
3) a third step for forming a first resistor film configured to serve as a base part of at least one thermopile configured to sense a temperature increase of the infrared ray receiver, wherein the thermopile has a cross sectional shape that includes at least one protruding part, wherein the at least one thermopile is made of a polysilicon and is covered with a protective film made of a silicon oxidized film, wherein the at least one thermopile is harder than the protective film;
4) a fourth step for forming a first insulative film configured to cover the first resistor film and to serve as a protective film of the thermopile;
5) a fifth step for forming a second resistor film on the first resistor film by selectively removing the first insulative film on the first resistor film, the second resistor film being configured to serve as a protruding part of the thermopile;
6) a sixth step including the following sub-steps:
   i) a first sub-step for forming a second insulative film configured to cover the second resistor film and to serve as the protective film of the thermopile, and
   ii) a second sub-step for forming a beam configured to support the infrared ray receiver to the semiconductor substrate, wherein the beam includes the at least one thermopile;
7) a seventh step for forming an etching hole through the protective film; and
8) an eighth step including the following sub-steps:
   i) a first sub-step for selectively removing the semiconductor substrate and the sacrificial layer via the etching hole,
   ii) a second sub-step for forming a void between the semiconductor substrate and the infrared ray receiver, and
   iii) a third sub-step for isolating the semiconductor substrate from the infrared ray receiver, wherein the infrared ray receiver is disposed above the semiconductor substrate in such a manner as to be isolated from the semiconductor substrate.

8. The method of producing the infrared ray sensing element as claimed in claim 7, wherein the first step includes a sub-step for forming an etching stopper for determining a range of the void configured to heat-isolate the infrared ray receiver from the substrate.

* * * * *